(12) United States Patent
Banno

(10) Patent No.: US 8,310,889 B2
(45) Date of Patent: Nov. 13, 2012

(54) SEMICONDUCTOR DEVICE

(75) Inventor: Akihiro Banno, Kanagawa (JP)

(73) Assignee: Renesas Electronics Corporation, Kawasaki-Shi, Kanagawa (JP)

(*) Notice: Subject to any disclaimer, the term of this patent is extended or adjusted under 35 U.S.C. 154(b) by 292 days.

(21) Appl. No.: 12/801,652

(22) Filed: Jun. 18, 2010

(65) Prior Publication Data

US 2011/0051541 A1 Mar. 3, 2011

(30) Foreign Application Priority Data

Aug. 27, 2009 (JP) ................................. 2009-196332

(51) Int. Cl.
*G11C 7/00* (2006.01)
(52) U.S. Cl. ................. 365/201; 365/233.1; 365/230.06; 365/185.23; 365/189.011; 365/189.15; 365/189.16; 365/189.17; 365/189.19; 365/189.05; 365/230.02; 365/233.11; 365/233.16; 365/233.17
(58) Field of Classification Search .................. 365/201, 365/233.1, 230.06, 185.23, 189.011, 189.15, 365/189.16, 189.17, 189.19, 189.05, 230.02, 365/233.11, 233.16, 233.17
See application file for complete search history.

(56) References Cited

U.S. PATENT DOCUMENTS 5,400,342 A * 3/1995 Matsumura et al. .......... 714/719
6,005,815 A * 12/1999 Nakano ......................... 365/201
2007/0177436 A1* 8/2007 Davis et al. ............... 365/189.05
2009/0059699 A1* 3/2009 Ono .............................. 365/201
2009/0154257 A1* 6/2009 Fujioka et al. ............ 365/189.05
2009/0316497 A1* 12/2009 Kuroki et al. ............ 365/189.07

FOREIGN PATENT DOCUMENTS

| JP | 5-282885 A | 10/1993 |
|---|---|---|
| JP | 10-283800 A | 10/1998 |
| JP | 11-120794 A | 4/1999 |
| JP | 11-297099 A | 10/1999 |
| JP | 2005-32375 A | 2/2005 |

\* cited by examiner

*Primary Examiner* — Fernando Hidalgo
(74) *Attorney, Agent, or Firm* — McGinn IP Law Group, PLLC

(57) ABSTRACT

A semiconductor device including a plurality of memory cells arranged in a matrix pattern, a write amplifier which writes write data to the memory cell in synchronization with a clock, a sense amplifier which reads out the write data written in the memory cell in synchronization with the clock, a plurality of column select switches which connect the plurality of the memory cells with the sense amplifier and the write amplifier, a column address decoder which makes the column select switch corresponding to one column among the plurality of the memory cells a conductive state based on a column address, a row address decoder which activates the memory cell of one row based on a row address, and a test write circuit which writes data corresponding to a logical level of a test signal to the memory cell based on a test mode signal.

8 Claims, 9 Drawing Sheets

SEMICONDUCTOR DEVICE

INCORPORATION BY REFERENCE

This application is based upon and claims the benefit of priority from Japanese patent application No. 2009-196332, filed on Aug. 27, 2009, the disclosure of which is incorporated herein in its entirety by reference.

BACKGROUND

1. Field of the Invention

The present invention relates to a semiconductor device, and more particularly to a semiconductor device which conducts a reliability test using a dynamic signal (Dynamic Voltage Stress Test).

2. Description of Related Art

A defective rate of a semiconductor device decreases with time in an initial period just after manufacturing (hereinafter, failure which is generated in this period is referred as initial failure"), and the defective rate becomes constant after a predetermined period has passed. When further time has passed, the defective rate increases. This is so-called bathtub curve. In semiconductor devices, to decrease the defective rate after shipment, an acceleration test and a function test after the acceleration test are conducted to prevent the shipping of the device having defect. A dynamic voltage stress/screening (DVS) test is one of the acceleration tests. In the DVS test, test data which toggles semiconductor elements is input continuously to accelerate time degradation of semiconductor elements.

When this DVS test is conducted to for example a memory which selects and accessed one element from a plurality of elements under a normal usage state, it is necessary to select one element and toggle the elements in series which is a time-consuming process. To solve this problem, Japanese Unexamined Patent Application Publications No. 5-282885, 11-297099, 11-120794, 2005-32375, and 10-283800 disclose methods for reducing the time of DVS test.

These patent applications each describe conducting the DVS test by a semiconductor device which includes a plurality of memory cells arranged in a matrix pattern. In these patent applications, when the DVS test is conducted, a plurality of rows or columns are selected and all test data are collectively written into memory cells arranged in the plurality of rows or columns. Here, the techniques of these patent applications reduce the time of the DVS test.

SUMMARY

However, in a semiconductor device such as a memory, in general, data writing into the memory cell which is a target of the test is performed in synchronization with a clock signal. Therefore, the above patent application Publications need two clock cycles to toggle a memory cell once. Further, in the patent application Publications, the speed of toggle is limited by the maximum clock frequency of the semiconductor device. Therefore, these patent application Publications have a problem that the toggle speed of the DVS test is limited by one-half of the maximum clock frequency of the semiconductor device, which makes it impossible to increase the speed of the DVS test.

According to an embodiment of the present invention, there is provided a semiconductor device including a plurality of memory cells arranged in a matrix pattern, a write amplifier which writes write data to one of the memory cells in synchronization with a clock, a sense amplifier which reads out the write data written in the memory cell in synchronization with a clock, a plurality of column select switches which connect the plurality of the memory cells with the sense amplifier and the write amplifier, a column address decoder which sets a column select switch corresponding to memory cells of one column among the plurality of the memory cells to a conductive state based on a column address, a row address decoder which activates a memory cells of one row among the plurality of the memory cells based on a row address, and a test write circuit which writes data corresponding to a logical level of a test signal to the memory cell based on a test mode signal.

According to a semiconductor device of the present invention, a test write circuit writes data corresponding to a logical level of a test signal to a memory cell regardless of the clock cycle in the test operation. Therefore, in the present invention, regardless of the maximum clock frequency of the semiconductor device, it is possible to perform toggle to memory cells with the cycles of a test signal. That is, the semiconductor device of the present invention can reduce the test time.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Hereinafter, exemplary embodiments will be explained with reference to drawings. In the following explanation, the present invention will be explained by taking a semiconductor device including an SRAM (Static Random Access Memory) as a memory cell as an example. However, the memory cell according to the present invention may be a DRAM (Dynamic Random Access Memory) or a flash memory, not only an SRAM.

Figure 1:
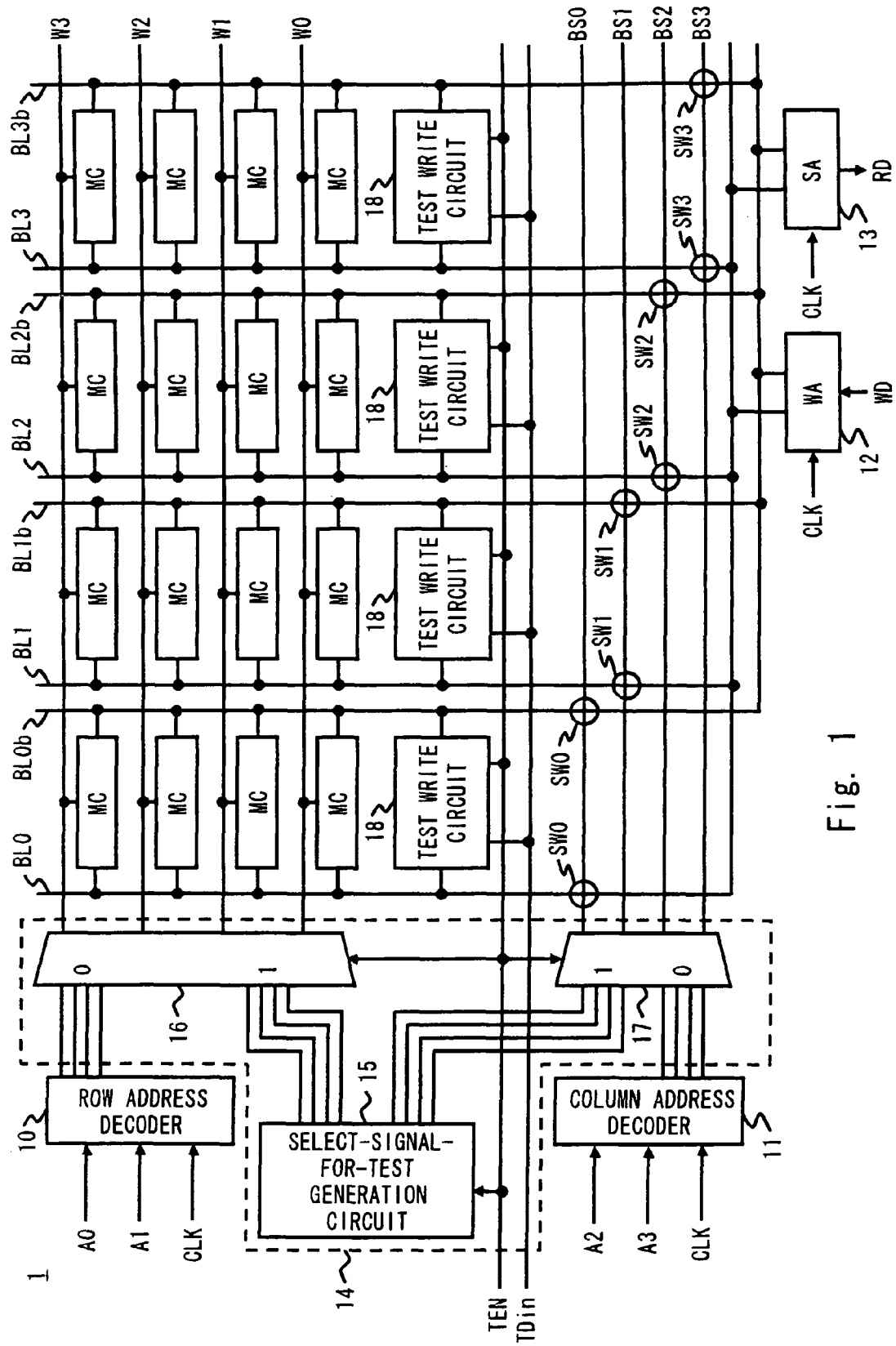
FIG. 1 is a block diagram showing a semiconductor device of a first exemplary embodiment of the present invention.

FIG. 1 is a block diagram showing a semiconductor device 1 of a first exemplary embodiment of the present invention. As shown in FIG. 1, the semiconductor device 1 includes a memory cell MC, a row address decoder 10, a column address decoder 11, column select switches SW0, SW1, SW2, and SW3, a write amplifier 12, a sense amplifier 13, a test mode control circuit 14, and a test write circuit 18.

The memory cell MC is one of memory cells of the SRAM. The semiconductor device 1 includes a plurality of the memory cells MC. The memory cells MC are arranged in a matrix pattern. Further, the memory cells MC include word lines W0 to W3 which connect to the memory cells MC which are arranged in the same row, and bit lines BL0 to BL3 and BL0b to BL3b which connect to the memory cells MC which are arranged in the same column. The semiconductor device 1 selects one memory cell MC with any one of word lines and any one of bit line pairs in normal usage state and write or read data to or from the selected memory cell MC. Note that, FIG. 1 shows the memory cells MC with four rows by four columns; however the number of the memory cells MC can be set arbitrarily.

The row address decoder 10 activates the memory cells MC of one row among the plurality of memory cells MC based on a row address which is specified by address signals A0 and A1. The row address decoder 10 performs the activation of the word line specified by the row address in synchronization with a clock signal CLK. Note that, in the example of FIG. 1, since the memory cells MC are arranged in four rows, the semiconductor device 1 includes the word lines W0 to W3 corresponding to each row.

The column address decoder 11 sets column select switches corresponding to memory cells MC of one column among the plurality of the memory cells MC to a conduction state based on a column address specified by address signals A2 and A3. In the example of FIG. 1, since the semiconductor device 1 includes four pairs of bit lines, the column select switches SW0 to SW3 corresponding to each pair of bit lines are arranged. Further, the semiconductor device 1 includes column select lines BS0 to BS3 corresponding to the column select switches SW0 to SW3. These column select switches SW0 to SW3 are formed by NMOS transistors, for example.

The write amplifier 12 writes write data WD to the memory cell MC selected by the row address decoder 10 and the column address decoder 11 in synchronization with a clock. Specifically, the write amplifier 12 generates the write data having opposite logical levels each other based on write data WD inputted and outputs the generated write data to the bit line pair selected by the column address decoder 11. Then the write amplifier 12 writes the write data to the memory cell MC which is in the column selected by the row address decoder 10 through the pair of the bit lines.

The sense amplifier 13 reads out the write data written in the memory cell MC selected by the row address decoder 10 and the column address decoder 11 in synchronization with a clock. The write data read out by the sense amplifier 13 is output as read data RD.

The test mode control circuit 14 activates the memory cells of at least two rows regardless of an output of the row address decoder 10 while the test mode signal TEN is in an enable state (hereinafter referred to as "test period"). In this exemplary embodiment, the test mode control circuit 14 is assumed to activate all memory cells in the test period. Furthermore, the test mode control circuit 14 sets column select switches corresponding to rows connected to the memory cell MC to which data is written to a non-conductive state regardless of the output of the column address decoder 11 in the test period. In the first exemplary embodiment, the test mode control circuit 14 is assumed to set all the column select switches to a non-conductive state in the test period.

On the other hand, the test mode control circuit 14 outputs control signals which are output from the row address decoder 10 and the column address decoder 11 to the word lines W0 to W3 and column select lines BS0 to BS3 in the normal operation period. That is, the test mode control circuit 14 sets signal levels of the word lines and the column select lines to a test mode regardless of the address signal in the test period, and outputs control signals which are output from the row address decoder 10 and the column address decoder 11 to the word lines and the column select lines.

The test mode control circuit 14 includes a select-signal-for-test generation circuit 15, and selectors 16 and 17. The select-signal-for-test generation circuit 15 sets select signals which are output to the word lines W0 to W3 to an active state (for example, high level) and sets select signals which are output to the column select lines BS0 to BS3 to a non-conductive state (for example, low level) while the test mode signal TEN indicates the test period (for example, high level).

The selector 16 selects any of one of the output of the row address decoder 10 and the outputs of the select-signal-for-test generation circuit 15 according to the test mode signal TEN and outputs the selected one to the word lines W0 to W3. Specifically, the selector 16 outputs the output of the row address decoder 10 to the word lines W0 to W3 when the test mode signal TEN is in a disenable state (for example, low level), and outputs the output of the select-signal-for-test generation circuit 15 to the word lines W0 to W3 when the test mode signal TEN is in an enable state (for example, high level).

The selector 17 selects any one of the output of the column address decoder 11 and the output of the select-signal-for-test generation circuit 15 according to the test mode signal TEN and outputs the elected one to the column select lines BS0 to BS3. Specifically, the selector 17 outputs the output of the column address decoder 11 to the column select lines BS0 to BS3 when the test mode signal TEN is in a disenable state (for example, low level), and outputs the output of the select-signal-for-test generation circuit 15 to the column select lines BS0 to BS3 when the test mode signal TEN is in an enable state (for example, high level).

The test write circuit 18 writes data corresponding to a logical level of the test signal TDin to the memory cells MC based on the test mode signal TEN. Specifically, the test write circuit 18 writes data to the plurality of the memory cells MC by driving corresponding pair of the bit lines based on a logical level of the test signal TDin when the test mode signal TEN is in an enable state. Further, the test write circuit 18 sets the output to a high impedance state to remove the influence on the pair of bit lines when the test mode signal TEN is in a disenable state. In the present exemplary embodiment, the test write circuit 18 is provided for each pair of the bit lines.

Figure 2:
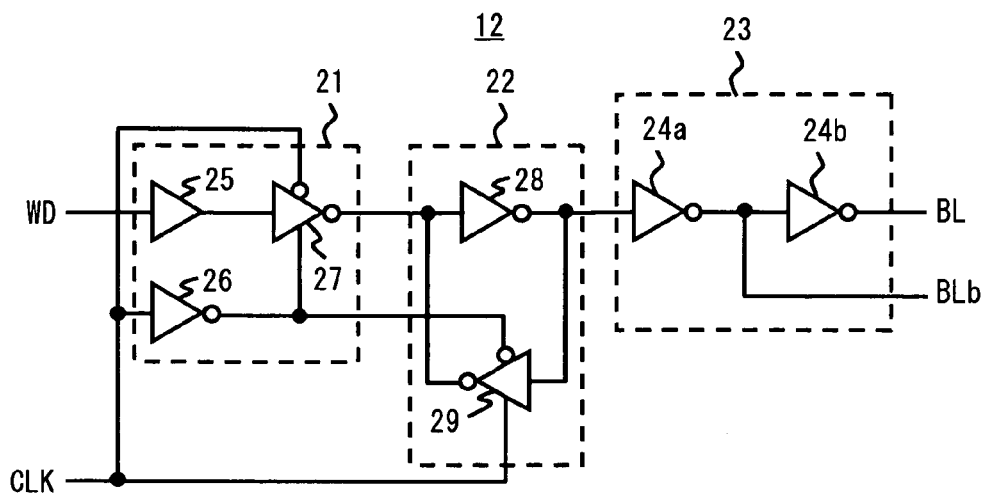
FIG. 2 is a block diagram showing a write amplifier of the first exemplary embodiment of the present invention.

Here, the write amplifier 12 and the test write circuit 18 which are used in the semiconductor device 1 will be explained in detail. First, FIG. 2 is a block diagram showing the write amplifier 12 of the first exemplary embodiment of the present invention. As shown in FIG. 2, the write amplifier 12 includes a write data receive circuit 21, a latch unit 22, and a drive unit 23.

The write data receive circuit 21 includes a buffer 25, an inverter 26, and a clocked inverter 27. The clocked inverter 27 operates based on a clock signal CLK and an inverted clock signal which is obtained by inverting the clock signal CLK by the inverter 26. The buffer 25 is provided between the clocked inverter 27 and a write data input terminal. That is, the write data receive circuit 21 outputs the write data WD to the latch unit 22 when the clock signal CLK is low level, and sets the output to a high impedance state when the clock signal CLK is high level.

The latch unit 22 includes an inverter 28 and a clocked inverter 29. An input terminal of the inverter 28 is connected to output terminals of the write data receive circuit 21 and the clocked inverter 29. An output terminal of the inverter 28 is connected to input terminals of the clocked inverter 29 and the driving unit 23. The clocked inverter 29 operates based on the clock signal CLK and the inverted signal obtained by inverting the clock signal CLK by the inverter 26. That is, the latch unit 22 receives the value output from the write data receive circuit 21 and output the inverted value to the driving unit 23 when the clock signal CLK is in a low level, and latches the value when is held while the clock signal CLK is in a high level.

The driving unit 23 includes inverters 24a and 24b. The inverter 24a generates data inverted by inverting the write data held in the latch unit 22 and outputs the generated data to a bit line BLb (the bit line BLb is connected to the bit lines BL0b to BL3b). The inverter 24b generates data further inverted by further inverting the write data output from the inverter 24a and outputs the generated data to a bit line BL (the bit line BL is connected to the bit lines BL0 to BL3). That is, the driving unit 23 generates data whose logical level is the same as that of the write data held in the latch unit 22 and its inverted data, and drives the pair of bit lines by the generated data.

As described above, the write amplifier 12 receives the write data in synchronization with the clock signal CLK and drives the pair of bit lines based on the received data.

Figure 3:
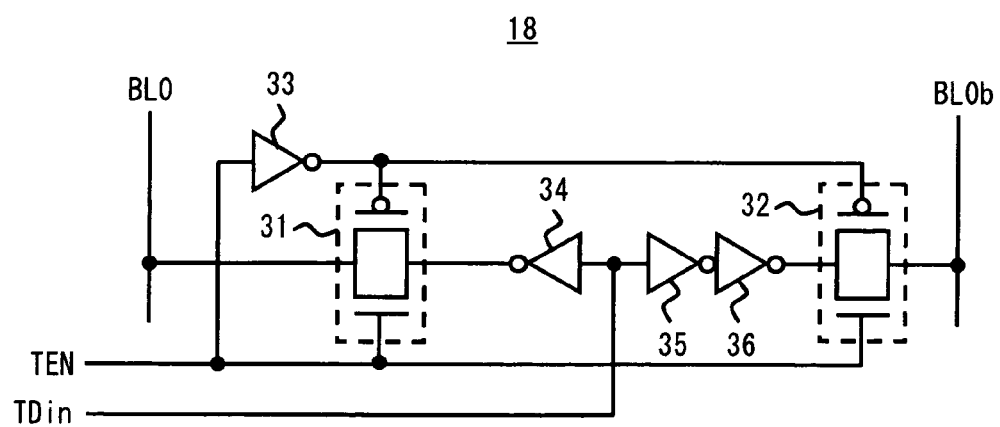
FIG. 3 is a block diagram showing a test write circuit of the first exemplary embodiment of the present invention.

FIG. 3 is a block diagram showing a test write circuit 18 of the first exemplary embodiment of the present invention. As shown in FIG. 3, the test write circuit 18 includes transfer switches 31 and 32, and inverters 33, 34, 35, and 36. The inverter 33 is provided to input an inverted test mode signal TEN to the transfer switches 31 and 32. The conductive state and non-conductive state of the transfer switches 31 and 32 are switched based on the test mode signal TEN and the signal obtained by inverting the test mode signal TEN. Specifically, the transfer switches 31 and 32 are in conductive state when the test mode signal TEN is enable (for example, high level) and are in non-conductive state when the test mode signal TEN is disenable (for example, low level).

The inverter 34 receives the test signal TDin and outputs a signal obtained by inverting the test signal TDin to the bit line BL0 through the transfer switch 31. The inverters 35 and 36 are connected in series, and output the signal whose logical level is the same as that of the test signal TDin to the bit line BL0b through the transfer switch 32. That is, the test write circuit 18 drives the pair of the bit lines by a signal generated based on the logical level of the test signal TDin when the test mode signal TEN is enable, and writes the value based on the logical level of the test signal TDin to the memory cell MC. Note that, the test write circuit 18 shown in FIG. 3 corresponds to the pair of the bit lines BL0 and BL0b, and other test write circuits 18 corresponding to other pairs of bit lines also have the same configuration.

Figure 4:
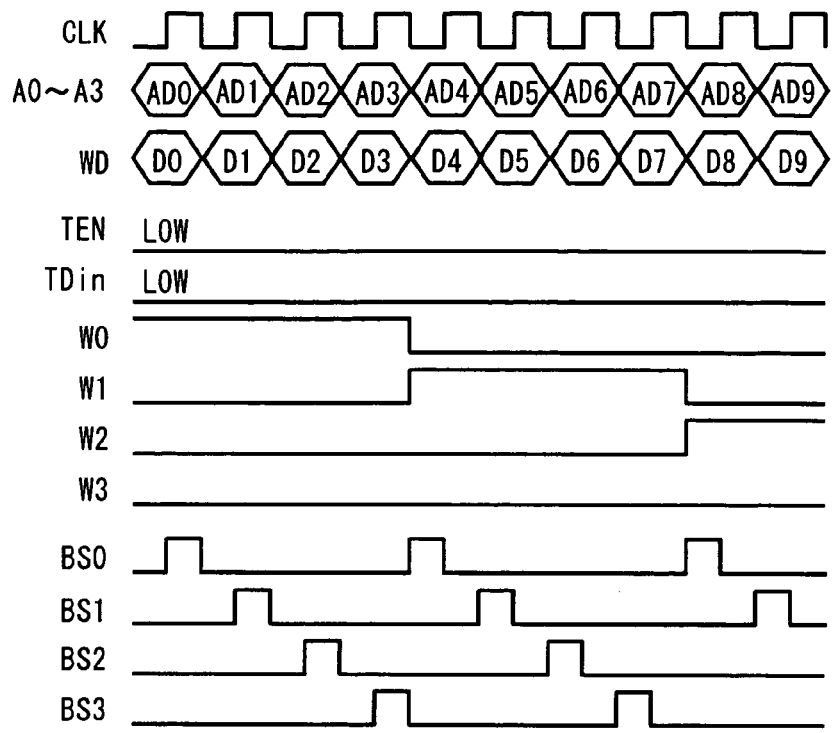
FIG. 4 is a timing chart showing a normal usage of the semiconductor device of the first exemplary embodiment of the present invention.
Figure 5:
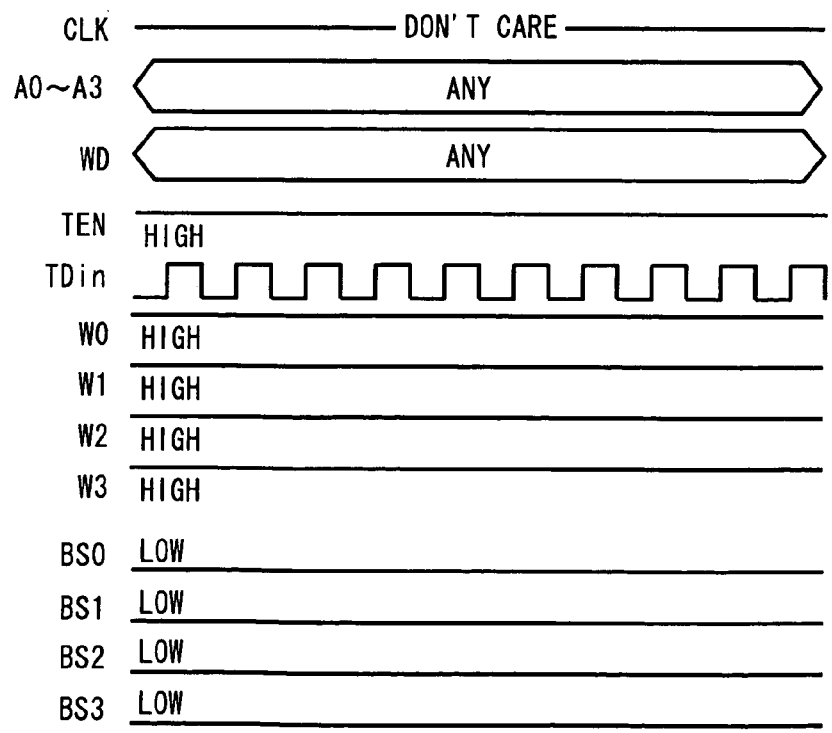
FIG. 5 is a timing chart showing a DVS test of the semiconductor device of the first exemplary embodiment of the present invention.

Next, an operation of the semiconductor device 1 will be explained. In the semiconductor device 1 data writing methods to the memory cell MC are different between the normal operation and the test operation. FIG. 4 is a timing chart showing a normal usage of the semiconductor device 1 of the first exemplary embodiment of the present invention, and FIG. 5 is a timing chart showing a DVS test of the semiconductor device 1 of the first exemplary embodiment of the present invention.

First, a normal operation of the semiconductor device 1 will be explained by using FIG. 4. As shown in FIG. 4, the semiconductor device 1 specifies the different memory cells by address signals A0 to A3 in synchronization with the clock signal CLK in the normal operation. Furthermore, the write amplifier of the semiconductor device 1 generates the write data D0 to D9 in synchronization with the clock signal CLK in the normal operation. Then the row address decoder 10 and the column address decoder 11 switch the signal levels of the word lines W0 to W3 and the column select lines BS0 to BS3 in synchronization with the clock signal CLK to activate the memory cell MC specified based on the address signals A0 to A3. By such an operation, the semiconductor device 1 writes the write data in synchronization with the clock signal CLK in the normal operation.

On the other hand, in the semiconductor device 1, in the normal operation, the test mode signal TEN and the test signal TDin are kept to a low level. Thus, operations of the test write circuit 18 and the select-signal-for-test generation circuit 15 of the semiconductor device 1 are disabled.

Next, a test operation of the semiconductor device 1 will be explained by using FIG. 5. As shown in FIG. 5, in the test operation, the test mode signal TEN input to the semiconductor device 1 becomes high level. Furthermore, the signal that repeats high level and low level are input to the semiconductor device 1 as the test signal TDin. Since this test signal TDin is a signal for toggling the memory cells MC, the clock signal CLK also can be used. Further, in the test operation, the test mode control circuit 14 sets the signal levels of the word lines W0 to W3 to high level based on the test mode signal TEN, and then activates all memory cells MC. Furthermore, in the test, the test mode control circuit 14 sets the signal levels of the column select lines BS0 to BS3 to low level, and then all column select switches become non-conductive state. By this, the semiconductor device 1 can toggle the memory cells according to the signal level of the test signal TDin regardless of the cycles of the address signals A0 to A3 and the clock signal CLK.

According to the first exemplary embodiment, the test write circuit 18 of the semiconductor device 1 drives the memory cells MC based on the logical level of the test signal TDin in the test operation. Hence, since the semiconductor device 1 can toggle the memory cells MC regardless the cycle of the clock signal CLK, DVS test for the memory cells can be performed more quickly.

Further, since the semiconductor device 1 can set a transition of the signal level of the test signal TDin arbitrarily, it is possible to toggle the memory cells MC based on an arbitrary pattern; therefore flexibility of the test can be increased.

Furthermore, in the semiconductor device 1, the timings of signals supplied to the memory cells and logical levels are determined by one signal (in the exemplary embodiment, the test signal TDin). Thus, unlike the conventional technique of writing data in synchronization with the clock signal CLK, it is not necessary to consider the delay between signals in the writing operation in the test mode. That is, in the semiconductor device 1 of the exemplary embodiment, it is easier to raise the speed of toggle with the test signal TDin.

Furthermore, in the semiconductor device 1, the test write circuit 18 is provided for each pair of the bit lines. Therefore, the number of the memory cells which are driven by one test write circuit 18 is small. Therefore, in the semiconductor device 1, it is possible to decrease the size of transistors of the test write circuit 18 (or decrease driving ability of the transistors) and decrease a mounting area.

Second Exemplary Embodiment

Figure 6:
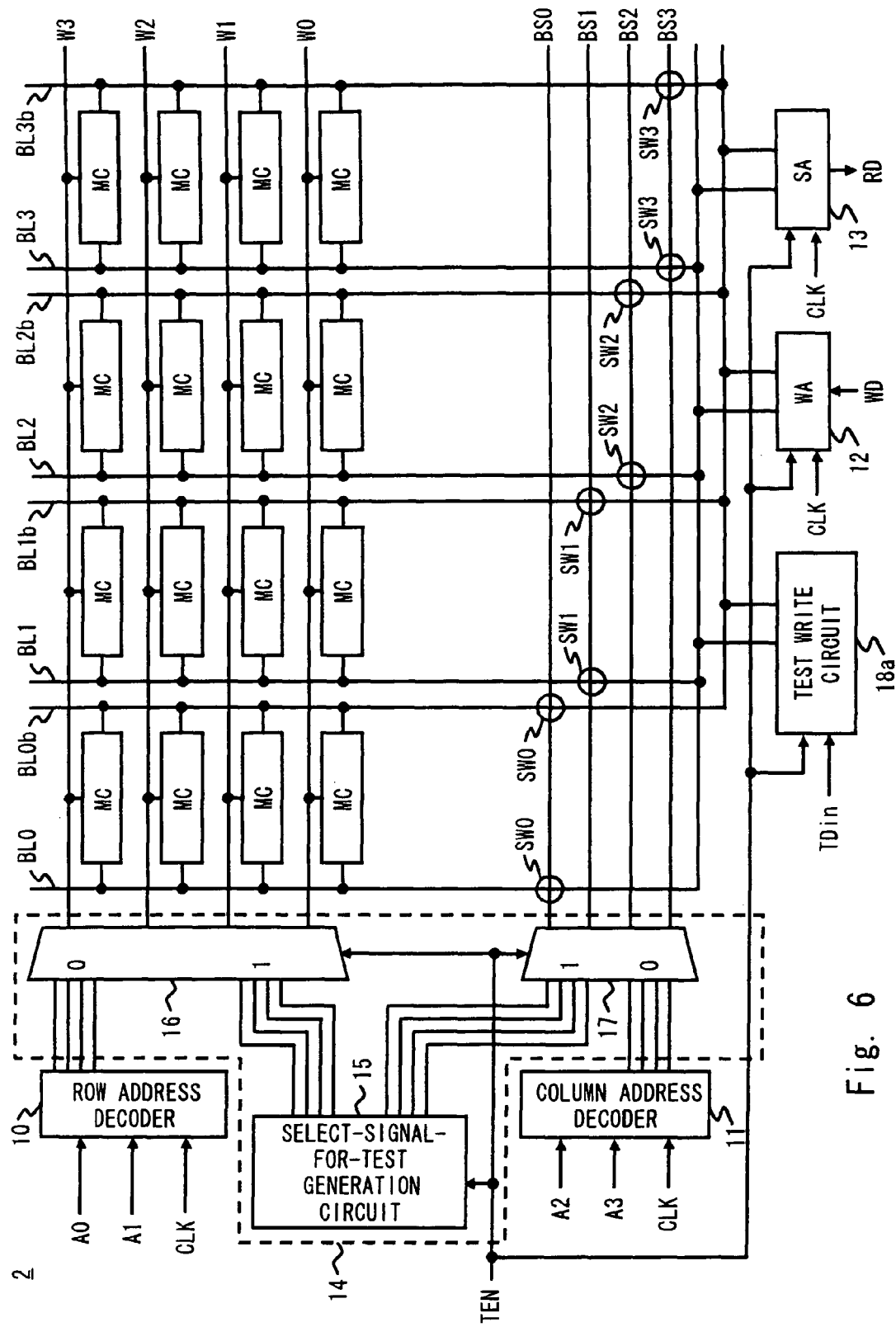
FIG. 6 is a block diagram showing a semiconductor device of a second exemplary embodiment of the present invention.

In a semiconductor device 2 of the second exemplary embodiment, one test write circuit 18 of the semiconductor device 1 of the first exemplary embodiment is provided for every plurality of rows. FIG. 6 is a block diagram showing the semiconductor device 2 of the second exemplary embodiment of the present invention.

As shown in FIG. 6, in the semiconductor device 2, a test write circuit 18a is provided in parallel with the write amplifier 12. The test write circuit 18a has improved driving ability than the test write circuit 18. The function of the test write circuit 18a is the same as that of the test write circuit 18.

Figure 7:
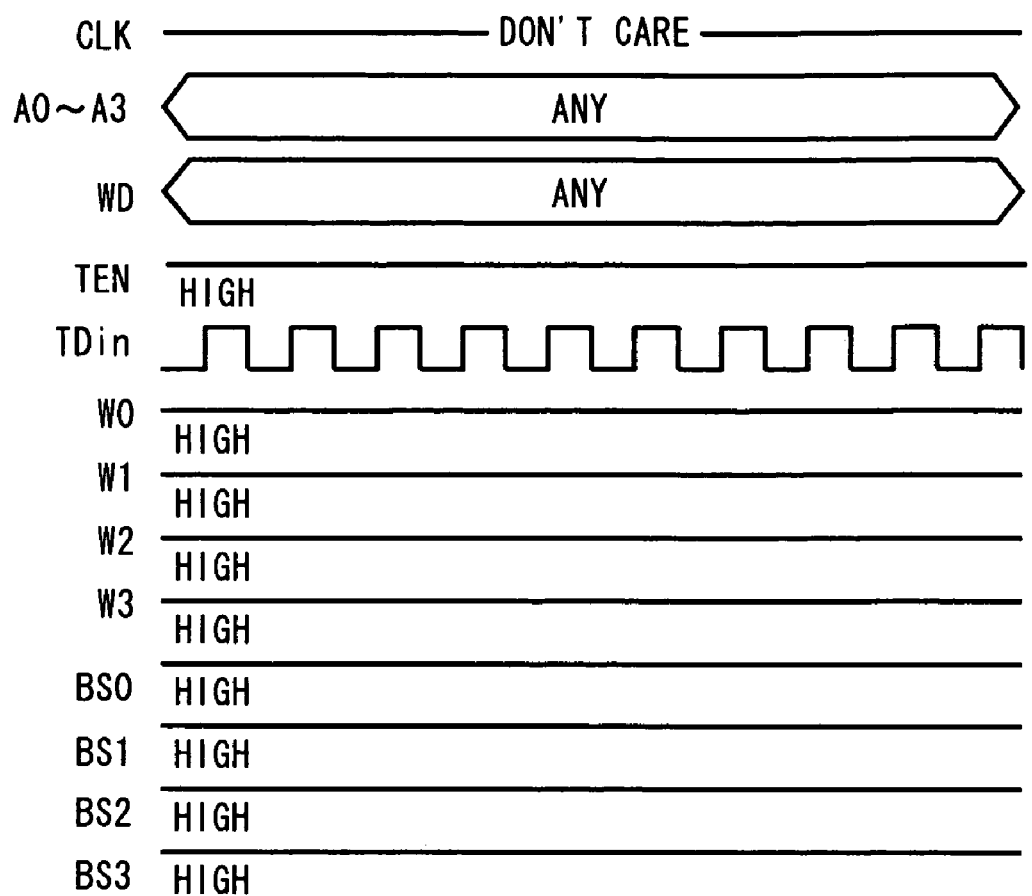
FIG. 7 is a timing chart showing a DVS test of the semiconductor device of the second exemplary embodiment of the present invention.

Further, in the semiconductor device 2, since the test write circuit 18a is provided in the write amplifier 12 side of the column select switches SW0 to SW3, the level of the signal of the column select lines output from the select-signal-for-test generation circuit 15 is different from the first exemplary embodiment. FIG. 7 is a timing chart showing a DVS test of the semiconductor device 2 of the second exemplary embodiment of the present invention.

As shown in FIG. 7, in the semiconductor device 2, only the signal level of the column select lines is different from the timing chart shown in FIG. 5. On the other hand, in the semiconductor device 2, the signal level of the column select lines BS0 to BS3 in the test operation is set to the high level. Hence, the column select switches SW0 to SW3 become the conductive state in the test operation. By generating such signals by the select-signal-for-test generation circuit 15, the memory cells MC which are provided over a plurality of rows and columns are driven by the signals which are generated by the test write circuit 18a in the test operation in the semiconductor device 2.

Note that, in the semiconductor device 2, if the test write circuit 18a is provided in the memory cell MC side of the column select switches SW0 to SW3, the operation of the semiconductor device 2 is the same as that shown by the timing chart of FIG. 5.

According to the second exemplary embodiment, in the semiconductor device 2, the memory cells MC which are provided over the plurality of rows and columns are driven by one test write circuit 18a. Therefore, the number of circuit elements of the test write circuit can be decreased. That is, in the semiconductor device 2, the number of the circuit elements of the test write circuit can be further decreased than the semiconductor device 1.

Third Exemplary Embodiment

Figure 8:
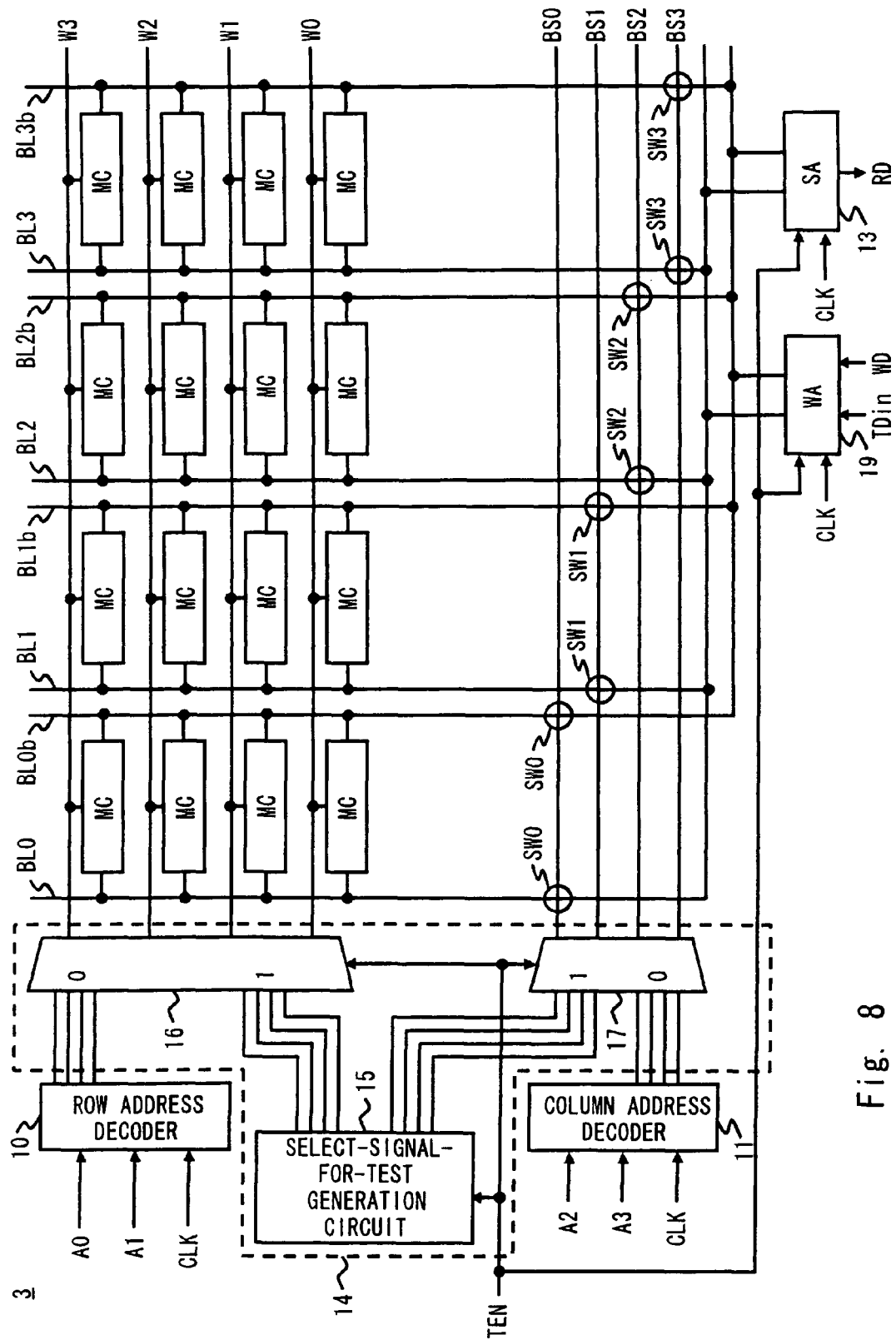
FIG. 8 is a block diagram showing a semiconductor device of a third exemplary embodiment of the present invention.
Figure 9:
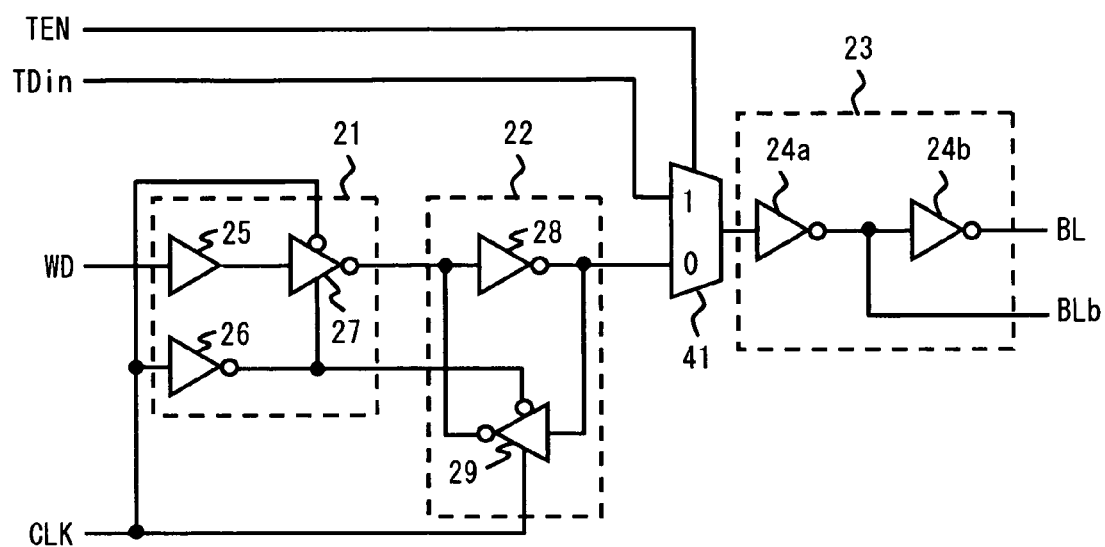
FIG. 9 is a block diagram showing a write amplifier of the third exemplary embodiment of the present invention.

FIG. 8 is a block diagram showing a semiconductor device 3 of a third exemplary embodiment of the present invention. As shown in FIG. 8, the semiconductor device 3 includes a write amplifier which has the function of a test write circuit. Here, the write amplifier of the third exemplary embodiment is referred to a write amplifier 19. FIG. 9 is a block diagram showing the write amplifier of the third exemplary embodiment of the present invention.

As shown in FIG. 9, the write amplifier 19 is different from the write amplifier 12 in that the write amplifier 19 further includes a selector 41. That is, the driving unit 23 of the write amplifier 19 is used as a driving unit of the write amplifier and is also used as a driving unit of the test write circuit. The selector 41 is provided between the latch unit 22 and the driving unit 23. An output signal of the latch unit 22 is input to one input terminal of the selector 41, and the test signal TDin is input to another input terminal. The selector 41 outputs the test signal TDin when the test mode signal TEN is enable, and outputs the output signal of the latch unit 22 when the test mode signal TEN is disenable. That is, the write amplifier 19 outputs the test signal TDin regardless of the clock signal CLK when the test mode signal TEN is enable, and outputs the write data WD in synchronization with the clock signal CLK when the test mode signal TEN is disenable.

According to the third exemplary embodiment, in the semiconductor device 3, the write amplifier 19 writes data to the memory cells according to the test mode and the normal operation mode. Hence, in the semiconductor device 3, as is similar to the first and the second exemplary embodiment, it is possible to perform toggle operation with the memory cells MC regardless of the cycle of the clock signal CLK in the test operation. Note that, the test operation of the semiconductor device 3 is the same as the operation of the semiconductor device 2 shown in FIG. 7.

Fourth Exemplary Embodiment

Figure 10:
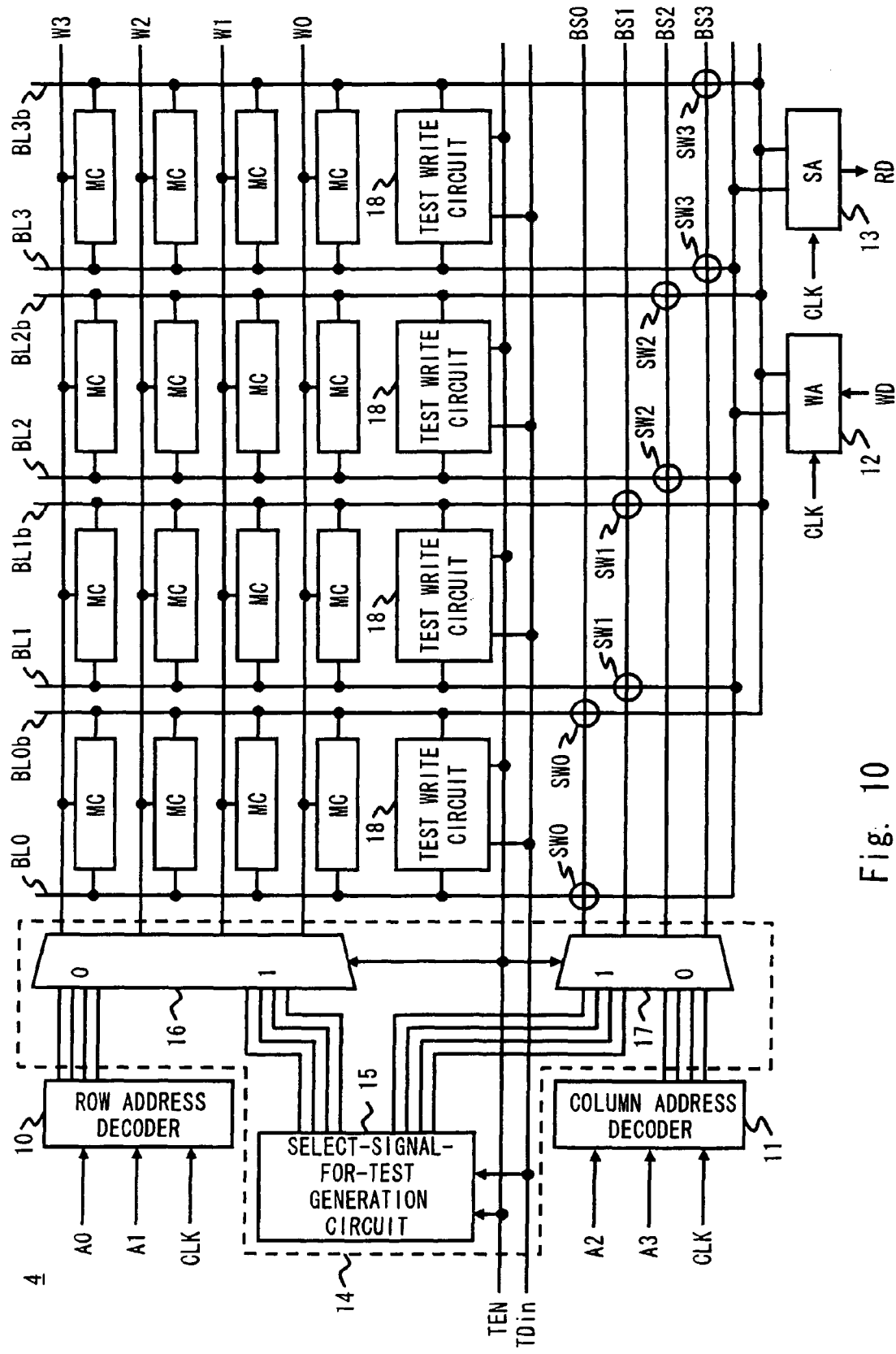
FIG. 10 is a block diagram showing a semiconductor device of a forth exemplary embodiment of the present invention.

A semiconductor device 4 of a forth exemplary embodiment is another example of the column select method activated by the semiconductor device 1 of the first exemplary embodiment in the test operation. Note that, in the semiconductor device 4, the test signal TDin is input to the select-signal-for-test generation circuit 15 to detect the switching timing of the row which is activated in the test operation. FIG. 10 is a block diagram showing the semiconductor device 4 of the forth exemplary embodiment of the present invention.

Figure 11:
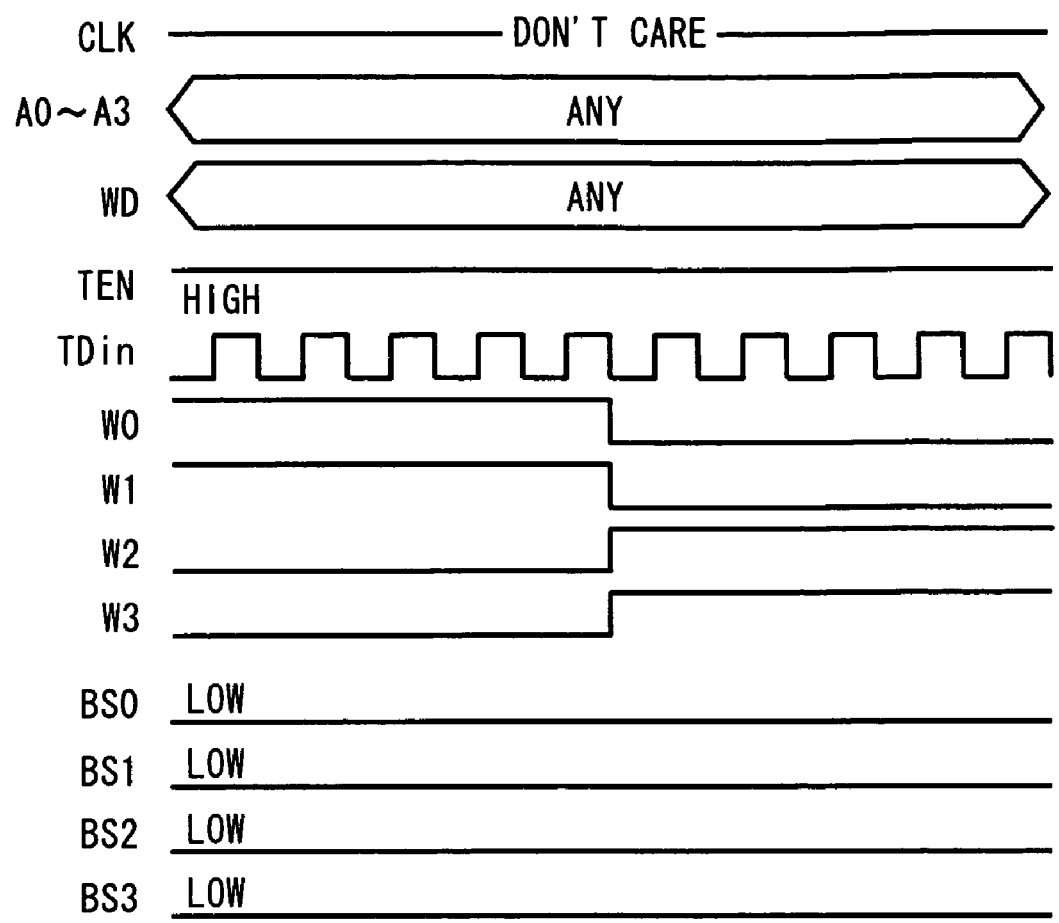
FIG. 11 is a timing chart showing a DVS test of the semiconductor device of the forth exemplary embodiment of the present invention.

FIG. 11 is a timing chart showing a DVS test of the semiconductor device 4 of the forth exemplary embodiment of the present invention. As shown in FIG. 11, in the semiconductor device 4, the row of the memory cells MC which is activated is switched by switching the voltage of the word line in the test period. In the example of FIG. 11, after toggle operation is performed five times to the memory cells MC which are connected to the word lines W0 and W1, toggle operation is performed five times to the memory cells MC which are connected to the word lines W2 and W3.

According to the fourth exemplary embodiment, in the semiconductor device 4, the number of the rows which are activated at one time is limited in the test period. By limiting the number of the rows, the number of the memory cells MC driven by the test write circuit 18 can be reduced. That is, in the semiconductor device 4, the driving ability of the test write circuit 18 can be lower than that of the semiconductor device 1; therefore, the circuit size of the test write circuit 18 can be smaller than that of the semiconductor device 1.

Note that, in the fourth exemplary embodiment, the number of the rows which are activated is limited; instead, the number of the columns may be reduced. This case is especially effective when a semiconductor device includes one test write circuit, as in the second and third embodiments.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

Furthermore, the first, second, third, and fourth exemplary embodiments can be combined as desirable by one of ordinary skill in the art.

What is claimed is:

1. A semiconductor device comprising:
a plurality of memory cells arranged in a matrix pattern;
a write amplifier which writes write data to one of the memory cells in synchronization with a clock;

a sense amplifier which reads out the write data written in the memory cell in synchronization with the clock;
a plurality of column select switches which connect the plurality of the memory cells with the sense amplifier and the write amplifier;
a column address decoder which sets a column select switch corresponding to a memory cell of one column among the plurality of the memory cells to a conductive state based on a column address;
a row address decoder which activates memory cells of one row among the plurality of the memory cells based on a row address; and
a test write circuit which writes data corresponding to a logical level of a test signal to the memory cell based on a test mode signal,
wherein the test write circuit includes a driving unit and outputs the test signal to the driving unit when the test mode signal is in an enable state, the test write circuit and the write amplifier use the driving unit in common.

2. A semiconductor device comprising:
a plurality of memory cells arranged in a matrix pattern;
a write amplifier which writes write data to one of the memory cells in synchronization with a clock;
a sense amplifier which reads out the write data written in the memory cell in synchronization with the clock;
a plurality of column select switches which connect the plurality of the memory cells with the sense amplifier and the write amplifier;
a column address decoder which sets a column select switch corresponding to a memory cell of one column among the plurality of the memory cells to a conductive state based on a column address;
a row address decoder which activates memory cells of one row among the plurality of the memory cells based on a row address;
a test write circuit which writes data corresponding to a logical level of a test signal to the memory cell based on a test mode signal; and
a test mode control circuit which activates at least two memory cells regardless of an output of the row address decoder when the test mode signal is in an enable state.

3. A semiconductor device comprising:
a plurality of memory cells arranged in a matrix pattern;
a write amplifier which writes write data to one of the memory cells in synchronization with a clock;
a sense amplifier which reads out the write data written in the memory cell in synchronization with the clock;
a plurality of column select switches which connect the plurality of the memory cells With the sense amplifier and the amplifier;
a column address decoder which sets a column select switch corresponding to a memory cell of one column among the plurality of the memory cells to a conductive state based on a column address;
a row address decoder which activates memory cells of one row among the plurality of the memory cells based on a row address;

a test write circuit which writes data corresponding to a logical level of a test signal to the memory cell based on a test mode signal; and
a test mode control circuit which activates at least two memory cells regardless of an output of the row address decoder when the test mode signal is in an enable state,
wherein the test write circuit is provided in each column.

4. A semiconductor device comprising:
a plurality of memory cells arranged in a matrix pattern;
a write amplifier which writes write data to one of the memo cells in synchronization with a clock;
a sense amplifier which reads out the write data written in the memory cell in synchronization with the clock;
a plurality of column select switches which connect the plurality of the memory cells with the sense amplifier and the write amplifier;
a column address decoder which sets a column select switch corresponding to a memory cell of one column among the plurality of the memo cells to a conductive state based on a column address;
a row address decoder which activates memory cells of one row among the plurality of the memory cells based on a row address;
a test write circuit which writes data corresponding to a logical level of a test signal to the memory cell based on a test mode signal; and
a test mode control circuit which activates at least two memory cells regardless of an output of the row address decoder when the test mode signal is in an enable state,
wherein one test write circuit is provided for every plurality of columns.

5. The semiconductor device according to claim 1, further comprising a test mode control circuit which activates at least two memory cells regardless of an output of the row address decoder when the test mode signal is in the enable state.

6. The semiconductor device according to claim 1, further comprising a test mode control circuit which sets a column select switch corresponding to a column to a non-conductive state regardless of an output of the column address decoder when the test mode signal is in the enable state, the column being connected to a memory cell to which data from the test write circuit is written.

7. The semiconductor device according to claim 1, further comprising a test mode control circuit which sets at least two column select switches among the column select switches to a conductive state regardless of an output of the column address decoder when the test mode signal is in the enable state.

8. The semiconductor device according to claim 2, wherein the test mode control circuit sets at least two column select switches among the column select switches to a conductive state regardless of an output of the column address decoder when the test mode signal is in the enable state.

* * * * *